United States Patent [19]

Holzapfel et al.

[11] Patent Number: 5,576,537
[45] Date of Patent: Nov. 19, 1996

[54] PHOTOELECTRIC POSITION MEASURING SYSTEM USING GRATINGS HAVING SPECIFIED DIMENSIONS TO SUPPRESS HARMONICS

[75] Inventors: Wolfgang Holzapfel, Obing; Andreas Franz, Trostberg, both of Germany

[73] Assignee: Dr. Johannes Heidenhain GmbH, Traunreut, Germany

[21] Appl. No.: 271,641

[22] Filed: Jul. 7, 1994

[30] Foreign Application Priority Data

Jul. 15, 1993 [DE] Germany .................. 43 23 712.6

[51] Int. Cl.$^6$ ................ H01J 3/14; H01J 40/14
[52] U.S. Cl. ................ 250/237 G; 250/231.16; 356/375; 33/707; 341/13
[58] Field of Search ............ 250/237 G, 231.14, 250/231.16; 356/375; 33/707; 341/13, 31

[56] References Cited

U.S. PATENT DOCUMENTS

| | | | |
|---|---|---|---|
| 3,427,463 | 2/1969 | Weyrauch | 250/237 |
| 3,578,979 | 5/1971 | Kawaguchi et al. | |
| 3,600,588 | 8/1971 | Sayce | |
| 4,595,991 | 6/1986 | Spies | |
| 4,602,436 | 7/1986 | Ernst | |
| 4,618,214 | 10/1986 | Horwitz | 350/162.2 |
| 4,680,466 | 7/1987 | Kuwahara et al. | 250/231 SE |
| 4,782,229 | 11/1988 | Ernst | 250/237 G |
| 5,026,164 | 6/1991 | Ichikawa | 356/373 |
| 5,155,355 | 10/1992 | Kabaya | 250/231.16 |
| 5,264,915 | 11/1993 | Huber et al. | |

FOREIGN PATENT DOCUMENTS

| | | |
|---|---|---|
| 0541828 | 5/1993 | European Pat. Off. |
| 1282988 | 11/1968 | Germany |
| 1905392 | 10/1969 | Germany |
| 1962099 | 7/1970 | Germany |
| 3209043 | 11/1982 | Germany |
| 3308841A1 | 10/1983 | Germany |
| 3727188A1 | 4/1988 | Germany |
| 4006789 | 9/1991 | Germany |
| 1311275 | 3/1973 | United Kingdom |
| 2094974 | 9/1982 | United Kingdom |

Primary Examiner—Edward P. Westin
Assistant Examiner—Stephen Calogero
Attorney, Agent, or Firm—Brinks Hofer Gilson & Lione

[57] ABSTRACT

A light source which emits light in strips is provided for illuminating a scale of a photoelectric position measuring system. The light modulated by the scale is converted into a sinusoidal scanning signal by a scanning plate. The scanning plate is a semiconductor substrate structured in strips. The width (A) of the light-emitting areas and the width (B) of the interspersed non-emitting areas of the light source is such that defined harmonics are filtered out of the scanning signal. The scanning plate is of such configuration that further harmonics are suppressed.

18 Claims, 4 Drawing Sheets

PHOTOELECTRIC POSITION MEASURING SYSTEM USING GRATINGS HAVING SPECIFIED DIMENSIONS TO SUPPRESS HARMONICS

FIELD OF THE INVENTION

The invention relates to a photoelectric linear or angular position measuring system for determining the position of gratings which can be displaced in relation to each other. In particular, a light source formed on a semiconductor substrate has a plurality of light emitting areas which are spaced apart by non-emitting areas in the measuring direction. A scanning grating, also formed on a semiconductor substrate, has a plurality of light sensitive areas which are separated by insensitive areas in the measuring direction. The ratio of the widths of the light emitting areas to the non-emitting areas and the widths of the light sensitive areas to the non-sensitive areas are selected to suppress predefined harmonics.

BACKGROUND OF THE INVENTION

Photoelectric measuring systems are used particularly with processing machines for measuring the relative position of a tool with respect to a workpiece to be processed. They are also used with coordinate-measuring machines for determining the position and dimensions of test objects.

German Patent Publication DE 40 06 789 A1 discloses a measuring system having a scanning grating applied directly to the light-sensitive surface of a semiconductor substrate. The scanning grating can be either printed or glued directly on the flat light-receiving surface of the semiconductor substrate. Such a structure simplifies the process of manufacturing the measuring system. A similar device is described in U.S. Pat. No. 3,600,588 hereby incorporated by reference.

German Patent Publication DE 32 09 043 A1 discloses an incremental measuring system having a scanning grating in the form of a semiconductor substrate in which active light-sensitive strips, spaced apart from each other in the measuring direction, are embodied as receiver elements. The embodiment of a scanning grating in the form of light sensitive strips is also described in U.S. Pat. No. 3,600,588 and British Patent 1,311,275.

It is also known to use a flat light-emitting semiconductor light source having a grating formed by light-shielding strips which are spaced apart from each other applied to the light-emitting surface of the semiconductor for illuminating an incremental scale. Such a measuring system is described in U.S. Pat. No. 5,155,355, which is hereby incorporated by reference.

SUMMARY OF THE INVENTION

According to one aspect of the invention, a photoelectric measuring system is provided having a light source, scale and scanning plate. The light source includes a plurality of light emitting areas which are separated from each other by non-emitting areas in the measuring direction. The scale includes a periodic graduation positioned to receive light emitted from the light-emitting areas of the light source and positioned to scan the scale which is movable with respect to the scanning plate. The scanning plate used to scan the scale and generate at least one position-dependent scanning signal includes a plurality of light sensitive areas which are separated from each other by non-sensitive areas in the measuring direction. The light-emitting areas of the light source are dimensioned to suppress predetermined orders of harmonics and the light sensitive areas of the scanning plate are dimensioned to suppress predetermined additional orders of harmonics.

According to another aspect of the invention, a scanning plate used in a photoelectric measuring system is provided having a substrate with a first layer of a first conductivity applied to a surface of the substrate. A second layer of a second conductivity is applied to at least a plurality of portions of the surface of the first layer. The portions of the second layer which overlie the first layer form light sensitive areas, the sensitive areas being separated from one another by insensitive areas.

According to still another aspect of the invention, a light source used in a photoelectric measuring system is provided having a substrate and a first layer of a first conductivity applied to a surface of the substrate. A second layer of a second conductivity is applied to at least a plurality of portions of the surface of the first layer. The portions of the second layer which overlie the first layer form light emitting areas, the light emitting areas being separated from one another by non-emitting areas.

It is an object of the invention to provide a simply constructed position measuring system wherein predetermined harmonics in the scanning signals are suppressed so that a high degree of measuring accuracy is assured.

An advantage of the present invention is found in that the light source and the scanning plate can be constructed by using simple methods known from semiconductor production technology to generate scanning signals which are nearly free of harmonics. In addition, a compact design results from such construction.

The invention itself, together with objects and attendant advantages, will best be understood by reference to the following detailed description taken in conjunction with accompanying drawings. It should be understood, however, that this description is to be illustrative rather than limiting, the scope of the invention being defined by the appended claims and equivalents thereof.

DETAILED DESCRIPTION OF THE PRESENTLY PREFERRED EMBODIMENTS

Figure 1:
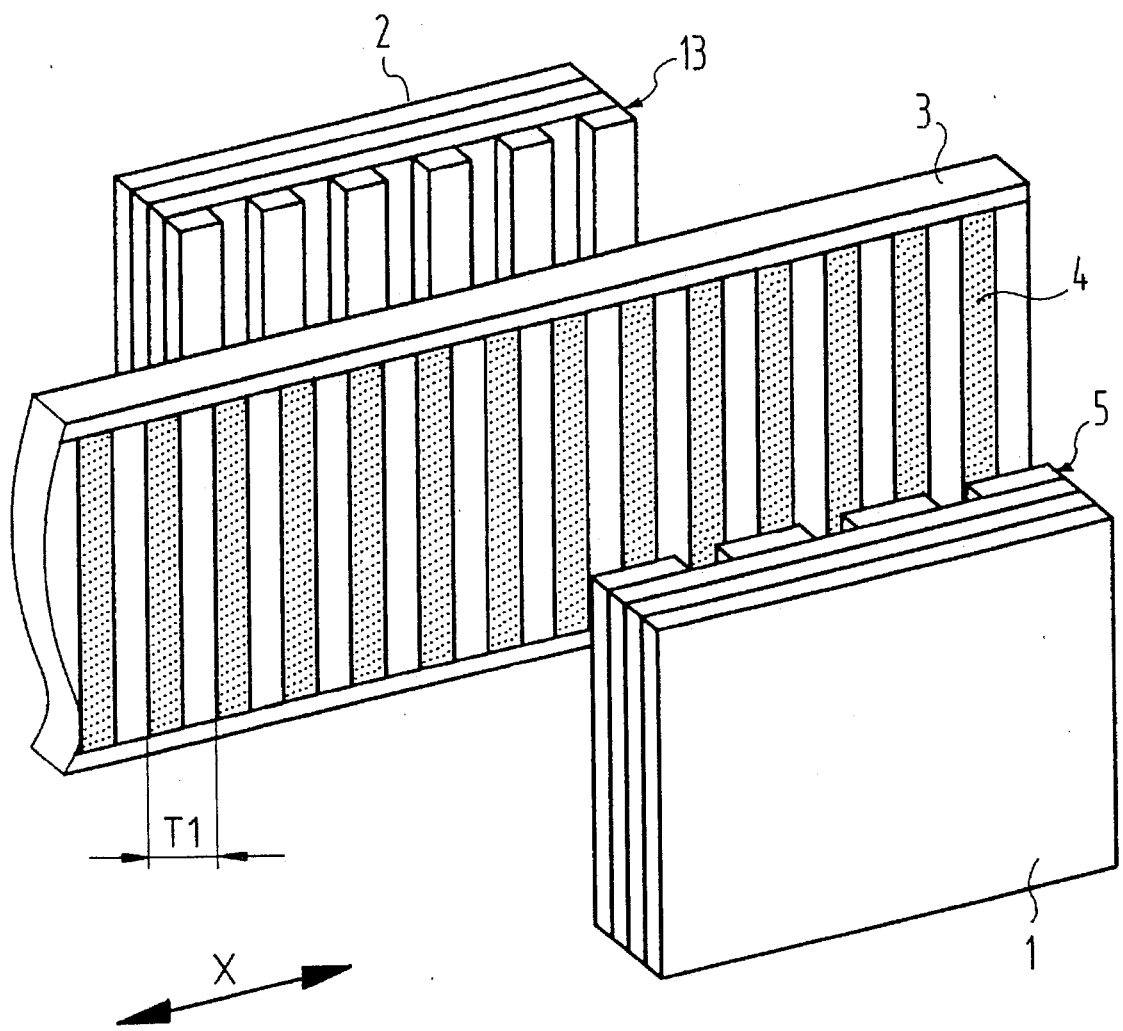
FIG. 1 illustrates schematically a photoelectric linear measuring system according to a preferred embodiment of the present invention.

FIG. 1 illustrates schematically a photo-electric linear measuring system according to a preferred embodiment of the present invention. The linear measuring system includes a light source 1, a scanning plate 2 and a scale 3. The scale 3 is displaceable along the measuring direction illustrated by arrow X relative to the light source 1 and scanning plate 2. Such a measuring system is also referred to as a three-grating measuring system. In a preferred embodiment, the scale 3 is formed by a glass body with an incremental graduation 4 formed either on a surface of the glass body or within the glass body. The incremental graduation 4 is formed by a series of alternating transparent and opaque lines and has an index period of T1 as illustrated.

Figure 2:
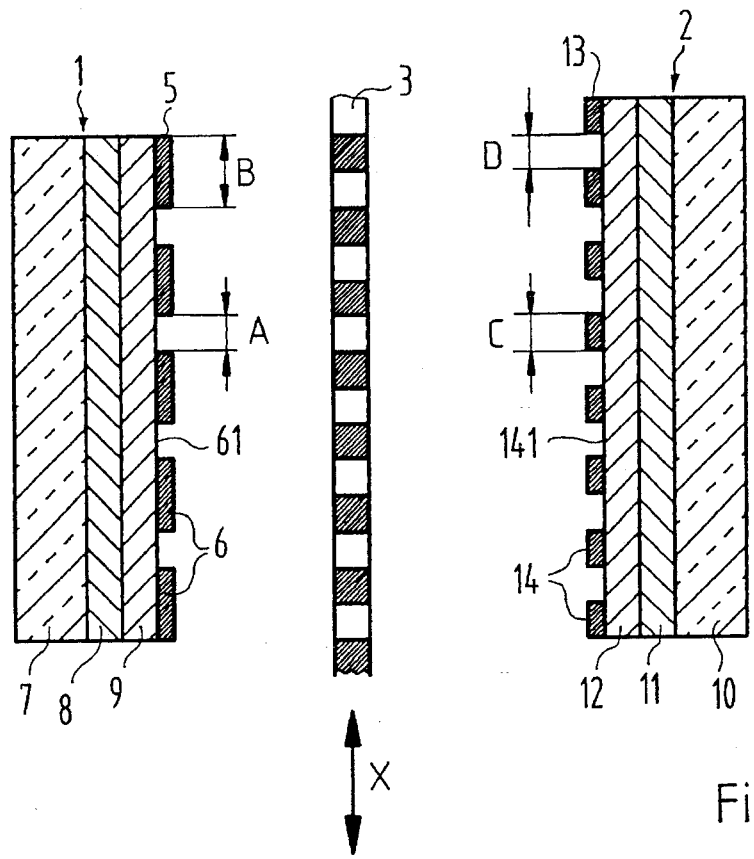
FIG. 2 illustrates a cross-sectional view of the linear measuring system shown in FIG. 1.

FIG. 2 illustrates a cross-sectional view of the linear measuring system shown in FIG. 1. The light source 1 includes a semiconductor substrate having a grating 5 applied thereto. The substrate includes a base body 7 preferably formed of glass, metal or a semiconductor material. A first semiconductor layer 8 of N-type material or conductivity is applied to the base body 7. A second semiconductor layer 9 of P-type material or conductivity is applied on the first semiconductor layer 8. The first and second semiconductor layers 8 and 9 form a PN junction. The grating 5 includes light shielding bars 6 applied to a surface of the substrate. In particular, the light shielding bars 6 are applied to the exposed surface of the second semiconductor layer 9. The space between two adjacent bars 6 is an effectively light transmitting area 61.

The light shielding bars 6 extend vertically or perpendicularly with respect to the measuring direction X. These bars 6 are formed in a known manner by a lithographic process on the semiconductor light source 1 which emits light over a large surface. In a preferred embodiment, the width B of a light shielding bar 6 is greater than the width A of gap 16 between individual bars 6. In a preferred embodiments the width B of the light shielding bars 6 and the width A of the gap 61 are uniform. The gaps A form the areas 61 which emit light in strip form. In a preferred embodiment, the ratio of the width of the gap A to the width B of the bar 6 is 1:2.

The scanning plate 2 also includes a semiconductor substrate having a grating 13 applied thereto. The substrate includes a base body 10, a first semiconductor layer 11 of N-type material and a second semiconductor layer 12 of P-type material. A large light-sensitive surface is created by the PN junction formed in this manner. The scanning grating 13 applied directly to the surface of the second semiconductor layer 12 consists of a plurality of light-shielding bars 14 spaced apart in the measuring direction X. The gaps 141 between light shielding bars 14 are the effective light-sensitive areas of the scanning grating 2. In a preferred embodiment, the width C of a bar 14 corresponds to the width D of gap 141. In a preferred embodiment, the ratio of the width D of the gap 141 to the width C of a bar 14 is 1:1.

By selecting a 1:1 ratio for grating 13, all even-numbered harmonics are suppressed. In addition, by selecting a 1:2 ratio for grating 5, all harmonics of the 3rd, 6th, 9th, etc. order (i.e. all whole-number multiples of 3) are suppressed. Thus, unlike the measuring system disclosed in U.S. Pat. No. 3,427,463, it is not necessary to employ a scale 3 specially designed for the suppression of harmonics. This is advantageous in that the gratings 5 and 13 required for filtering the predetermined harmonics, can be made relatively short in the measuring direction, which increases accuracy of the measuring system and simplifies its manufacture. With respect to the measuring system disclosed in U.S. Pat. No. 3,427,463 an electrical push-pull circuit is used to suppress even-numbered harmonics. It has been shown that in actuality it is not possible to completely suppress the even-numbered harmonics by using such circuits. The present invention, in contrast, can effectively suppress even-numbered harmonics through the physical construction of either grating 5 of the light source or grating 13 of the scanning plate 2 in addition to suppressing multiples of the 3rd harmonic. In addition, these particularly interfering harmonics are distributed over the grating 5 of the light source 1 and the grating 13 of the scanning plate 2 thereby attaining a particularly high modulation degree.

While particular ratios of the widths of bars 6 and 14 with respect to gaps 61 and 141 of grating 5 and 13 respectively have been disclosed, other ratios may be chosen and it is not intended that the present invention be limited to the ratios disclosed.

In addition to suppressing a predetermined harmonic, the ratios of the gratings 5 and 13 are selected so that one of the gratings, either grating 5 or grating 13, suppresses at least one additional harmonic of the scanning signal than the other grating. As previously described with respect to FIG. 2, the 1:1 ratio of grating 13 suppresses the even-numbered harmonics and the 1:2 ratio of grating 5 additionally suppresses harmonics having whole-number multiples of 3. The ratio of grating 5 that accomplishes such an additional suppression when the grating 13 has a ratio of 1:1 is defined below by equations (1) and (2):

$$B = M_1 \times \frac{P}{n} \tag{1}$$

$$A = M_2 \times \frac{P}{n}, \tag{2}$$

is the index period of grating 5, n is the order number of the harmonic of the scanning signal to be suppressed and $M_1$ and $M_2$ are whole numbers where $M_1 + M_2 = n$. Of course it will be appreciated that equations (1) and (2) can be used to define the ratio of grating 13 where grating 5 has a ratio of 1:1.

Figure 3:
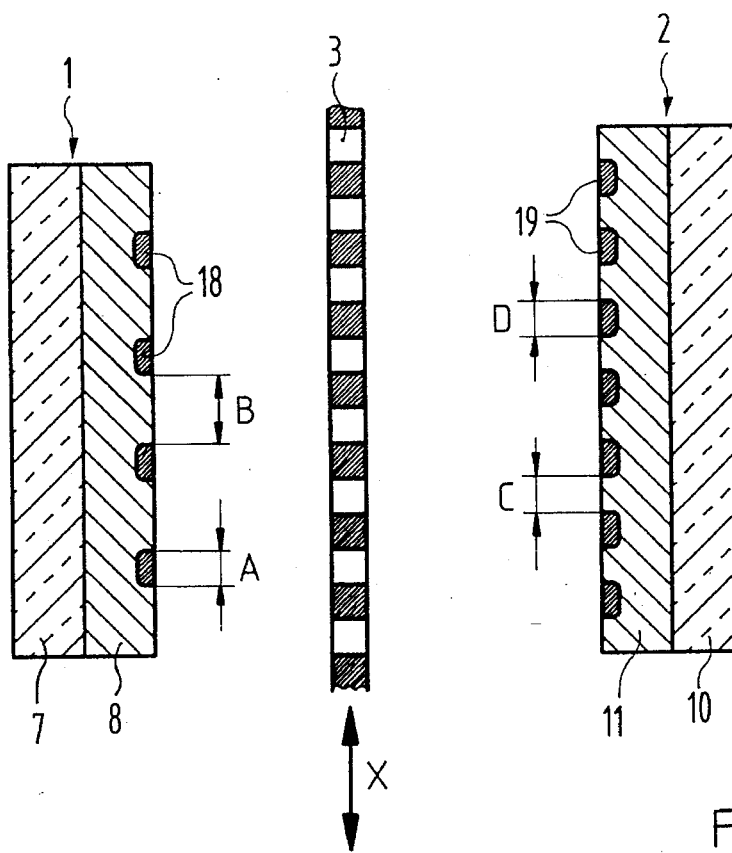
FIG. 3 illustrates a cross-sectional view of a linear measuring system according to another preferred embodiment of the present invention.

FIG. 3 illustrates a cross-sectional view of a linear measuring system according to another embodiment of the present invention. The light source 1 consists of a base body 7 with an N-type material semiconductor layer 8. Strips 18 of P-type material are formed in the N-type semiconductor layer 8. The strips 18 extend perpendicularly to the measuring direction. The strips 18 form light emitting surface areas. The strips 18 are separated from one another by the N-type material semiconductor layer 8. In this preferred embodiment, the need for light shielding bars is unnecessary because the PN junctions formed by semiconductor layer 8 and P-type material light emitting areas 18 are isolated from each other by the semiconductor layer 8. Thus, the grating is formed by the PN junctions and the areas between them without the necessity of applying light shielding bars.

The scanning plate 2 also consists of a single semiconductor substrate on which a semiconductor layer 11 of the N-type is applied to a base body 10. P-type material light sensitive areas 19, spaced apart in the measuring direction, have been formed in this semiconductor layer 11 by doping to form PN junctions. Each PN junction is a light-sensitive area 19 so that as with the light source previously described, here, too, the use of light-shielding bars can be omitted. The grating is formed by the PN junctions and the areas located between them.

The dimensions of the light-emitting areas 18 and the light-sensitive areas 19 may be the same as those previously described in the example shown in FIG. 2. In this case the width of a light-emitting area 18 corresponds to the gap A and the distance between the light-emitting areas 18 corresponds to the bar width B. The width of a light-sensitive area 19 corresponds to the gap D and the distance between the light-sensitive areas 19 corresponds to the bar width C.

Figure 4:
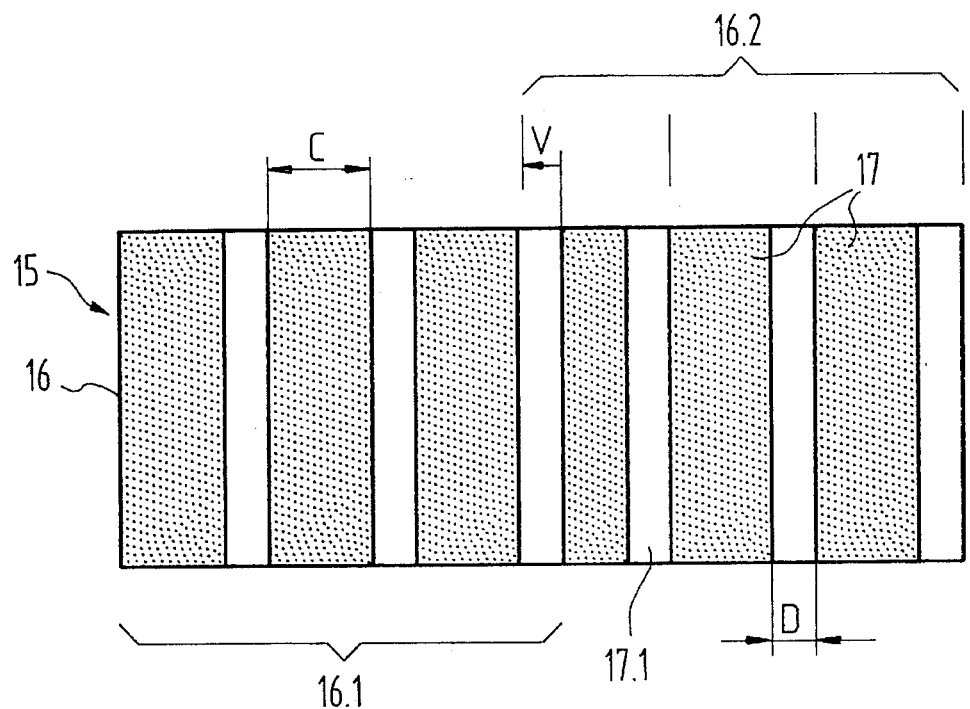
FIG. 4 illustrates a top view of a scanning plate according to a preferred embodiment of the present invention.

Other measures are also possible to suppress defined harmonics at one of the gratings 5 or 13. FIG. 4 illustrates such an example. FIG. 4 illustrates a top view of a scanning plate according to a preferred embodiment of the present invention. The scanning grating 16 is divided into two sections 16.1 and 16.2, between which there is a phase shift V of 90°. Both grating sections 16.1 and 16.2 have been applied to a common semiconductor substrate so that an addition of the light beams falling on sections 16.1 and 16.2 takes place. This results in the interfering harmonics of even-numbered orders operating in opposition and thereby canceling each other. It is also possible to suppress other harmonics if a different phase shift V is chosen. In a preferred embodiment, the ratio of the width D of the gap 171 to the width C of the light-shielding bars 17 has been chosen to be 1:2. By such a ratio selection, odd-numbered harmonics of the orders 3, 6, 9, etc. are additionally suppressed.

When employing scanning plate 15 in the linear measuring system according to FIG. 1, the grating 5 of the light source 1 is preferably embodied in such a way that the multiples of the 5th harmonic are additionally suppressed. To suppress multiples of the 5th harmonic, the ratio of the width A of the gap 61 (see FIG. 1) to the width B of the bars 6 is selected to be 2:3, for example.

It is possible to use several gratings of the light source and/or the scanning plate which are phase-shifted with respect to each other as shown in FIG. 4 for obtaining phase-shifted scanning signals.

The scanning grid 16 and/or the grating 5 of the light source 1 can also be embodied in accordance with European Patent Publications EP 0 106 951 B1, EP 0 157 177 B1 or EP 0 541 828 A1.

As already explained, the invention can be particularly advantageously employed in a three-grating measuring system. Howevers the invention is not limited to such an application. It can also be employed in a two-grating measuring system, wherein the one grating is the light source 1 and the grating which can be displaced relative to it in the measuring direction X is the scanning plate, i.e. one of these gratings also acts as of the scale.

While the preferred embodiments of the present invention have been illustrated using linear measuring systems, the present invention may also be embodied in an angular measuring system.

A common semiconductor substrate can be used alternatively for the light source and the scanning plate in all of the embodiments previously described. In such an embodiment, the gratings of the light source and the scanning plate are located in a common plane. Examples of this are illustrated in FIGS. 5 through 8.

Figure 5:
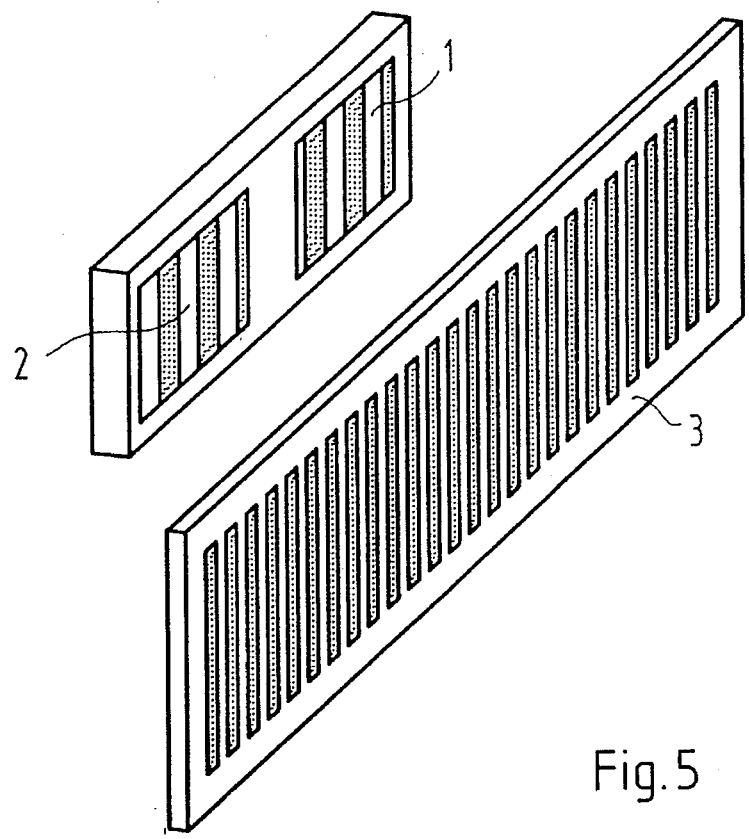
FIG. 5 illustrates a linear measuring system according to another preferred embodiment of the present invention.

FIG. 5 illustrates a linear measuring system according to another preferred embodiment in which both the light source 1 and the scanning plate 2 are located on a common substrate. Such a construction results in a compact design for the measuring system.

Figure 6:
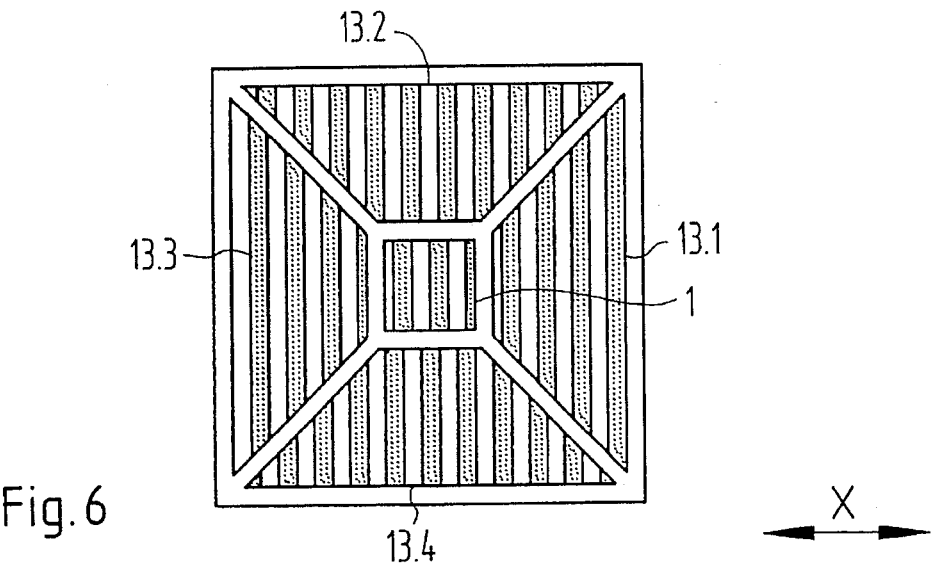
FIG. 6 illustrates a top view of a semiconductor substrate having a light source and scanning plate formed therein according to a preferred embodiment of the present invention.

FIG. 6 illustrates a top view of a semiconductor substrate having a light source 1 and four scanning gratings 13.1–13.4 integrated therein according to a preferred embodiment.

The light source 1 is disposed in the center of the substrate with respect to the scanning gratings 13.1 to 13.4 in order to generate four scanning signals which are respectively phase-shifted by 90° with respect to each other.

Figure 7:
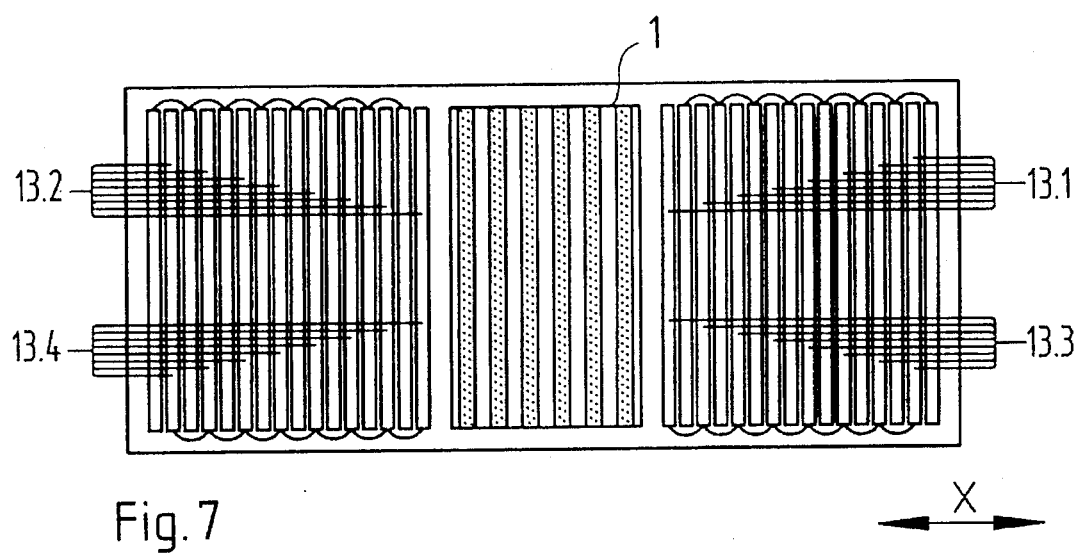
FIG. 7 illustrates a top view of a semiconductor substrate having a light source and scanning plate formed therein according to another preferred embodiment of the present invention.

FIG. 7 illustrates a top view of a semiconductor substrate having a light source 1 and scanning gratings 13.1–13.4 integrated therein according to another preferred embodiment of the present invention.

The scanning gratings 13.1 to 13.4 are disposed on both sides of the light source 1 viewed in the direction of measurement X. The scanning gratings 13.1, 13.3 as well as 13.2, 13.4 on respectively one side are phase-shifted by 180° with respect to each other. It is particularly advantageous if the scanning gratings 13.1 and 13.3 as well as 13.2 and 13.4 are interlaced.

Figure 8:
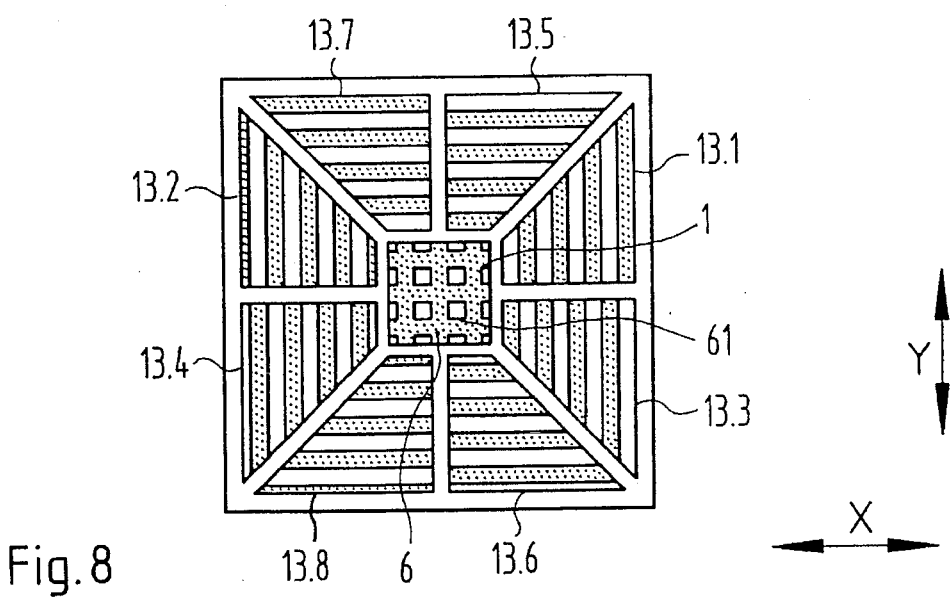
FIG. 8 illustrates a top view of a semiconductor substrate having a light source and scanning plate formed therein according to still another preferred embodiment of the present invention.

FIG. 8 illustrates a top view of a semiconductor substrate having a light source and scanning plate formed therein according to still another embodiment of the present invention. The light source is a structured light source for illuminating a cross-grating scale.

The light-emitting areas 61 are formed between the crossing light-shielding bars 6. The scanning gratings 13.1 and 13.3 for generating the 0° and 90° scanning signals for the X direction are disposed on one side of the light source 1 and the scanning grids 13.2 and 13.4 for generating the 270° and 180° scanning signals for the X direction on the other side.

The scanning gratings 13.5 to 13.8 for the Y direction are disposed above and below the light source 1. The functional principle of a cross-grating measuring system per se is described in German Patent Publication DE 40 41 584 A1, so that further explanations of this is not needed.

While this invention has been shown and described in connection with the preferred embodiments, it is apparent that certain changes and modifications, in addition to those mentioned above, may be made from the basic features of the present invention. Accordingly, it is the intention of the Applicants to protect all variations and modifications within the true spirit and valid scope of the present invention.

What is claimed is:

1. A photoelectric measuring system comprising:

a light source having a plurality of light emitting areas which are separated from each other by non-emitting areas in the measuring direction;

a movable scale having a periodic graduation positioned to receive light emitted from the light-emitting areas of the light source; and a scanning plate used to scan the scale and generate at least one position-dependent scanning signal, the scanning plate having a plurality of light sensitive areas which are separated from each other by non-sensitive areas in the measuring direction, wherein the light-emitting areas of the light source are dimensioned to suppress predetermined orders of harmonics and the light sensitive areas of the scanning plate are dimensioned to suppress predetermined additional orders of harmonics wherein if the predetermined orders suppressed by the light source are even ordered then the predetermined orders suppressed by the scanning plate are odd ordered and if the predetermined orders suppressed by the light source are odd ordered, then the predetermined orders suppressed by the scanning plate are even ordered.

2. A measuring system according to claim 1 wherein the scanning plate is in the form of a semiconductor substrate having a light sensitive area and the non-sensitive areas are formed by applying light-shielding bars on the light sensitive area so that the non-sensitive areas alternate with the light sensitive areas.

3. A measuring system according to claim 1 wherein the light source is in the form of a semiconductor substrate having a light emitting area and the non-emitting areas are formed by applying light shielding bar on the light sensitive areas of the substrate so that the light-emitting and non-emitting areas alternate.

4. A measuring system according to claim 2 wherein the light sensitive areas are in the form of strips.

5. A measuring system according to claim 3 wherein the light-emitting areas are in the form of strips.

6. A measuring system according to claim 1 wherein the scanning plate is a semiconductor substrate and the light sensitive areas are formed by strip-shaped PN junctions formed in the substrate.

7. A measuring system according to claim 1 wherein the light source is a semiconductor substrate and the light-emitting areas are formed by strip-shaped PN junctions formed in the substrate.

8. A measuring system according to claim 1 wherein the ratio of the widths of the light-emitting areas to the non-emitting areas is different from the ratio of the widths of the light sensitive areas to the non-sensitive areas.

9. A measuring system according to claim 1 wherein the ratio of the widths of the light-emitting areas to the non-emitting areas is 1:2 and the ratio of the widths of the light sensitive areas to the nonsensitive areas is 1:1.

10. A measuring system according to claim 1 wherein the light source and scanning plate are embodied on a single semiconductor substrate.

11. A measuring system according to claim 1 wherein the light source is a semiconductor substrate formed by a base body having a layer of N-type material applied to a surface of the base body and the light emitting areas are formed by strips of P-type material embedded in the N-type layer.

12. A measuring system according to claim 1 wherein the scanning plate is a semiconductor substrate formed by a base body having a layer of N-type material applied to a surface of the base body and the light sensitive areas are formed by strips of P-type material embedded in the N-type layer.

13. A photoelectric measuring system according to claim 1 wherein the light source further comprises:

a substrate;

a first layer of a first conductivity applied to a surface of the substrate; and a second layer of a second conductivity applied to at least a plurality of portions of the surface of the first layer wherein the portions in which the second layer overlies the first layer form light emitting areas, the light emitting areas being separated from one another by non-emitting areas wherein the second layer is applied over the entire first layer and light shielding bars are applied to the surface of the second layer wherein the bars are separated from one another by gaps exposing the second layer, the bars forming the non-emitting areas and the gaps forming the light emitting areas.

14. A photoelectric measuring system according to claim 13 wherein the gaps have a uniform width and the light shielding bars have a uniform width and the ratio of the widths of the gaps to the widths of the bars is 1:2.

15. A photoelectric measuring system comprising:

a light source having a plurality of light emitting areas which are separated from each other by non-emitting areas in the measuring direction;

a scale having a periodic graduation positioned to receive light emitted from the light emitting areas of the light source; and a scanning plate used to scan the scale and generate at least one positioned-dependent scanning signal, the scanning plate having a plurality of light sensitive areas which are separated from each other by non-sensitive areas in the measuring direction, wherein the light-emitting areas of the light source are dimensioned to suppress whole number multiples of the third harmonic and the light sensitive areas of the scanning plate are dimensioned to suppress even-numbered harmonics.

16. A photoelectric measuring system comprising:

a light source having a plurality of light emitting areas which are separated from each other by non-emitting areas in the measuring direction;

a scale having a periodic graduation positioned to receive light emitted from the light emitting areas of the light source; and a scanning plate used to scan the scale and generate at least one positioned-dependent scanning signal, the scanning plate having a plurality of light sensitive areas which are separated from each other by non-sensitive areas in the measuring direction, wherein the light-emitting areas of the light source are dimensioned to suppress even-numbered harmonics and the light sensitive areas of the scanning plate are dimensioned to suppress whole number multiples of the third harmonic.

17. A photoelectric measuring system comprising:

a light source having a plurality of light emitting areas which are separated from each other by non-emitting areas in the measuring direction;

a movable scale having a periodic graduation positioned to receive light emitted from the light-emitting areas of the light source;

a scanning plate used to scan the scale and generate at least one position-dependent scanning signal, the scanning plate having a plurality of light sensitive areas which are separated from each other by non-sensitive areas in the measuring direction, wherein the light-emitting areas of the light source are dimensioned to suppress predetermined orders of harmonics and the light sensitive areas of the scanning plate are dimensioned to suppress predetermined additional orders of harmonics wherein the light-emitting areas of the light source and the light sensitive areas of the scanning grating are disposed side by side in the same plane.

18. A photoelectric measuring system according to claim 17 wherein the light emitting areas of the light source are centrally disposed on a substrate and the light sensitive areas of the scanning plate are disposed adjacent to the light emitting areas.

\* \* \* \* \*